(12) United States Patent
Yoshida et al.

(10) Patent No.: US 11,925,078 B2
(45) Date of Patent: Mar. 5, 2024

(54) DISPLAY DEVICE INCLUDING FRAME REGION, AND BENDING REGION AROUND DISPLAY REGION

(71) Applicant: SHARP KABUSHIKI KAISHA, Sakai (JP)

(72) Inventors: Tokuo Yoshida, Sakai (JP); Tohru Okabe, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 512 days.

(21) Appl. No.: 17/275,631

(22) PCT Filed: Sep. 21, 2018

(86) PCT No.: PCT/JP2018/035120
§ 371 (c)(1),
(2) Date: Mar. 11, 2021

(87) PCT Pub. No.: WO2020/059126
PCT Pub. Date: Mar. 26, 2020

(65) Prior Publication Data
US 2022/0059638 A1  Feb. 24, 2022

(51) Int. Cl.
*H10K 77/00* (2023.01)
*H10K 59/131* (2023.01)
*H10K 77/10* (2023.01)
*H10K 102/00* (2023.01)

(52) U.S. Cl.
CPC .......... *H10K 59/131* (2023.02); *H10K 77/111* (2023.02); *H10K 2102/311* (2023.02)

(58) Field of Classification Search
CPC .......... H10K 59/131; H10K 2102/311; H10K 50/00; H10K 59/1213
USPC ....................... 257/40; 438/82, 99
See application file for complete search history.

(56) References Cited

U.S. PATENT DOCUMENTS

| | | | |
|---|---|---|---|
| 2005/0263761 A1 | 12/2005 | Kim et al. | |
| 2013/0037804 A1 | 2/2013 | Lee et al. | |
| 2014/0159002 A1* | 6/2014 | Lee | H10K 50/844 438/34 |
| 2014/0353670 A1 | 12/2014 | Youn et al. | |
| 2015/0287750 A1 | 10/2015 | Youn et al. | |
| 2016/0163745 A1* | 6/2016 | Choi | H01L 27/1225 257/40 |
| 2016/0204373 A1* | 7/2016 | Park | H10K 59/124 257/40 |

(Continued)

FOREIGN PATENT DOCUMENTS

| | | |
|---|---|---|
| JP | 2005340775 A | 12/2005 |
| JP | 2014232300 A | 12/2014 |

(Continued)

*Primary Examiner* — Didarul A Mazumder
(74) *Attorney, Agent, or Firm* — ScienBiziP, P.C.

(57) ABSTRACT

A display device includes the following: a resin substrate; a TFT layer disposed on the resin substrate, the TFT layer having a stack of, in sequence, a base coat film, a semiconductor film, a gate insulating film, a first metal film, an interlayer insulating film, a second metal film, and a flattening film; a light-emitting element disposed on the TFT layer and forming a display region; and a plurality of TFTs disposed in the TFT layer in the display region. The base coat film includes an amorphous silicon film disposed at least all over the display region.

9 Claims, 14 Drawing Sheets

(56) References Cited

U.S. PATENT DOCUMENTS

| | | | |
|---|---|---|---|
| 2017/0244063 A1* | 8/2017 | Furuie | H10K 50/844 |
| 2017/0278916 A1 | 9/2017 | Maruyama | |
| 2017/0288005 A1 | 10/2017 | Kawata | |
| 2017/0288007 A1* | 10/2017 | Shin | H10K 71/00 |
| 2018/0366531 A1* | 12/2018 | Kato | H01L 27/124 |
| 2019/0165071 A1 | 5/2019 | Maruyama | |
| 2019/0333981 A1 | 10/2019 | Kawata | |
| 2019/0355799 A1* | 11/2019 | Jeong | H10K 59/1213 |
| 2020/0006702 A1 | 1/2020 | Sonoda et al. | |
| 2020/0176549 A1 | 6/2020 | Kawata | |

FOREIGN PATENT DOCUMENTS

| | | |
|---|---|---|
| JP | 2017173505 A | 9/2017 |
| JP | 2017187580 A | 10/2017 |
| WO | 2017/158843 A1 | 9/2017 |
| WO | 2018/158953 A1 | 9/2018 |

* cited by examiner

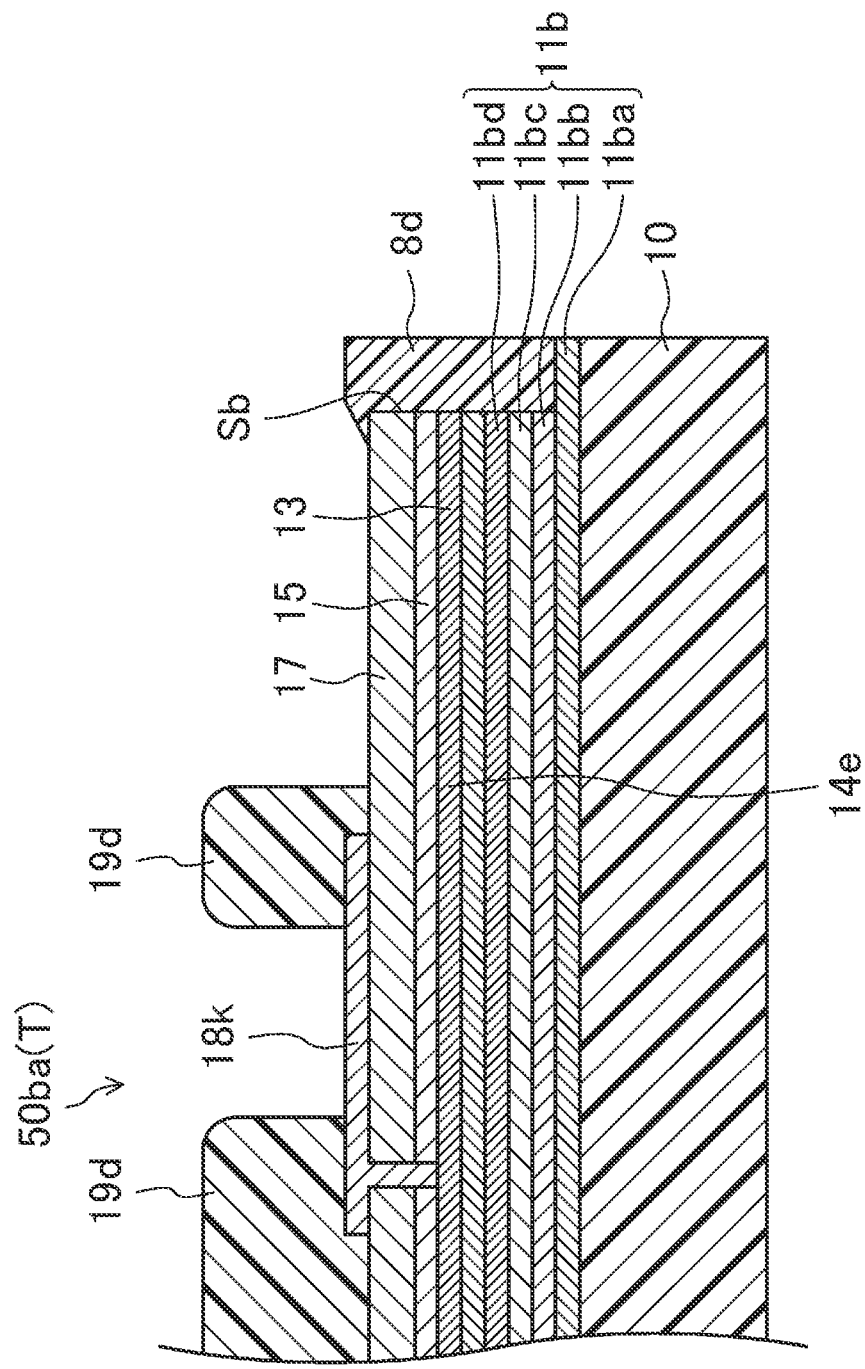

DISPLAY DEVICE INCLUDING FRAME REGION, AND BENDING REGION AROUND DISPLAY REGION

TECHNICAL FIELD

The present disclosure relates to a display device.

BACKGROUND ART

Attention has been recently drawn to self-emission organic EL display devices using organic electroluminescence (EL) elements, as display devices instead of liquid-crystal displays. One of such organic EL display devices that have been proposed is a flexible organic EL display device with a thin-film-transistor (TFT) layer and organic EL elements being sequentially stacked on a flexible resin substrate.

For instance, Japanese Patent Application Laid-Open No. 2017-173505 discloses a display device that includes a top-gate TFT having a channel layer of low-temperature polysilicon in a peripheral region, and includes a top-gate TFT having a channel layer of oxide semiconductor in a display region.

SUMMARY

Technical Problem

A TFT layer having top-gate TFTs includes the following components for instance: a base coat film disposed on a resin substrate; a semiconductor layer disposed on the base coat film; a gate insulating film disposed over the semiconductor layer; a gate electrode disposed on the gate insulating film; an interlayer insulating film disposed over the gate electrode; source and drain electrodes disposed on the interlayer insulating film; and a flattening film disposed over the source and drain electrodes. The source and drain electrodes are electrically connected to a source region of the semiconductor layer and a drain region of the semiconductor layer, respectively, via contact holes disposed in the gate insulating film and the interlayer insulating film. Here, as described in Japanese Patent Application Laid-Open No. 2017-173505, the semiconductor layer of oxide semiconductor with particles thereon can partly have a chipped portion resulting from cleaning. When the chipped portion in the semiconductor layer and either contact hole overlap, dry-etching, which is used for forming the contact holes, advances more than necessary, causing the bottom of the contact hole to reach the base coat film under the semiconductor layer and further reach the resin substrate under the base coat film. Accordingly, moisture inside the resin substrate enters the organic EL elements through the contact hole and the flattening film, thus degrading light-emitting layers of the organic EL elements.

To solve the above problem, it is an object of the present disclosure to prevent moisture ingress from a resin substrate into a light-emitting element.

Solution to Problem

To achieve the object, a display device according to one aspect of the present disclosure includes the following: a resin substrate; a TFT layer disposed on the resin substrate, the TFT layer having a stack of, in sequence, a base coat film, a semiconductor film, a gate insulating film, a first metal film, an interlayer insulating film, a second metal film, and a flattening film; a light-emitting element disposed on the TFT layer and forming a display region; and a plurality of TFTs disposed in the TFT layer in the display region. Each of the plurality of TFTs includes the following: a semiconductor layer composed of the semiconductor film on the base coat film, the semiconductor layer having a channel region, a source region, and a drain region, the channel region being interposed between the source and drain regions; the gate insulating film disposed over the semiconductor layer; a gate electrode composed of the first metal film on the gate insulating film, the gate electrode overlapping the channel region; the interlayer insulating film disposed over the gate electrode; a source electrode composed of the second metal film on the interlayer insulating film, the source electrode being electrically connected to the source region via a first contact hole disposed in the gate insulating film and the interlayer insulating film; and a drain electrode composed of the second metal film on the interlayer insulating film, the drain electrode being electrically connected to the drain region via a second contact hole disposed in the gate insulating film and the interlayer insulating film. The base coat film includes an amorphous silicon film disposed at least all over the display region.

Advantageous Effect of the Disclosure

The base coat film in one aspect of the present disclosure includes the amorphous silicon film disposed at least all over the display region, thus preventing moisture ingress from the resin substrate into the light-emitting element.

BRIEF DESCRIPTION OF DRAWINGS

FIG. 15 is a sectional view of the terminal section in the frame region of a modification of the organic EL display device according to the second embodiment of the present invention, and corresponds to FIG. 10.

DESCRIPTION OF EMBODIMENTS

Embodiments of the present invention will be detailed with reference to the drawings. The present invention is not limited to the following embodiments.

First Embodiment

Figure 1:
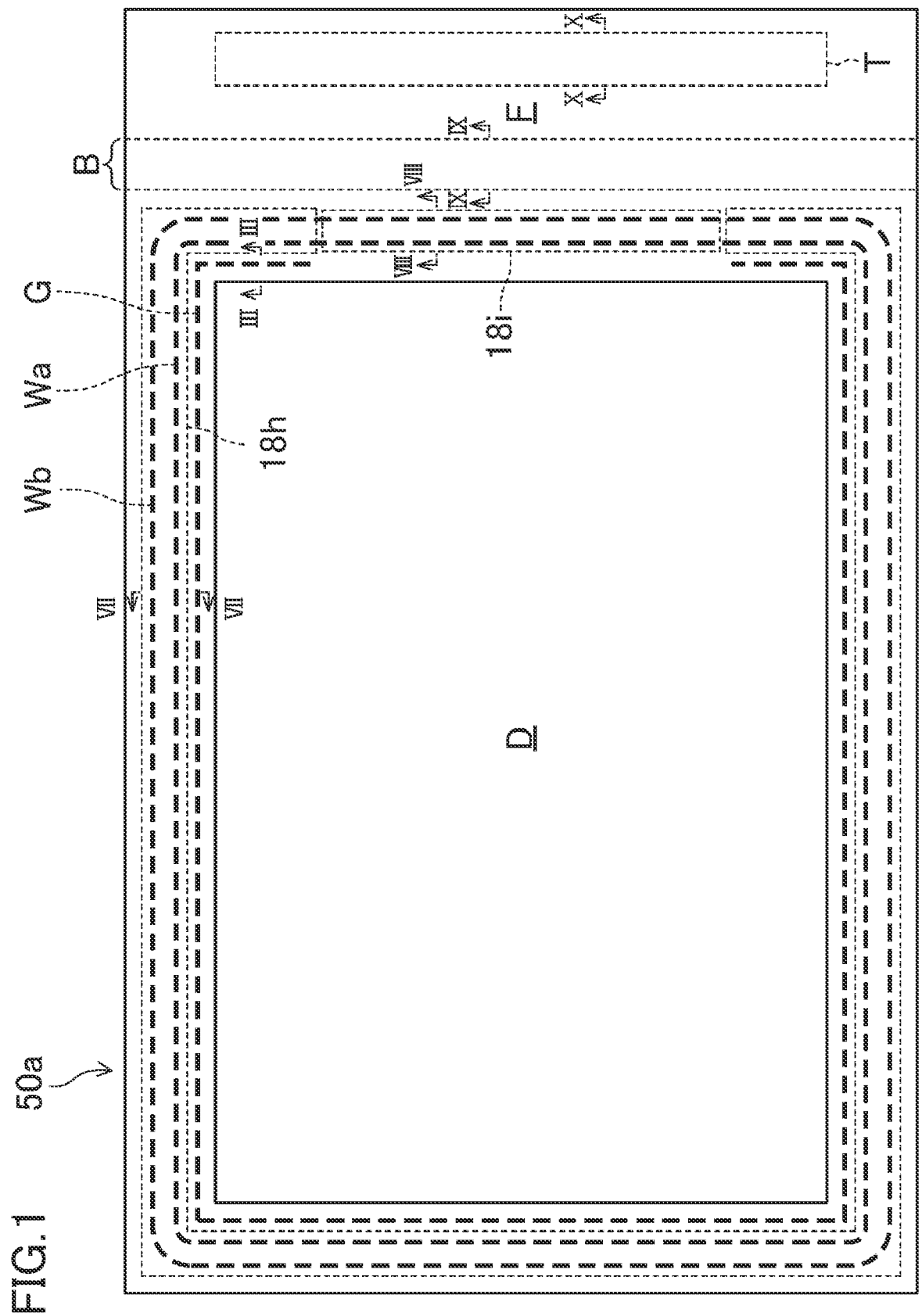
FIG. 1 is a schematic plan view of the configuration of an organic EL display device according to a first embodiment of the present invention.
Figure 2:
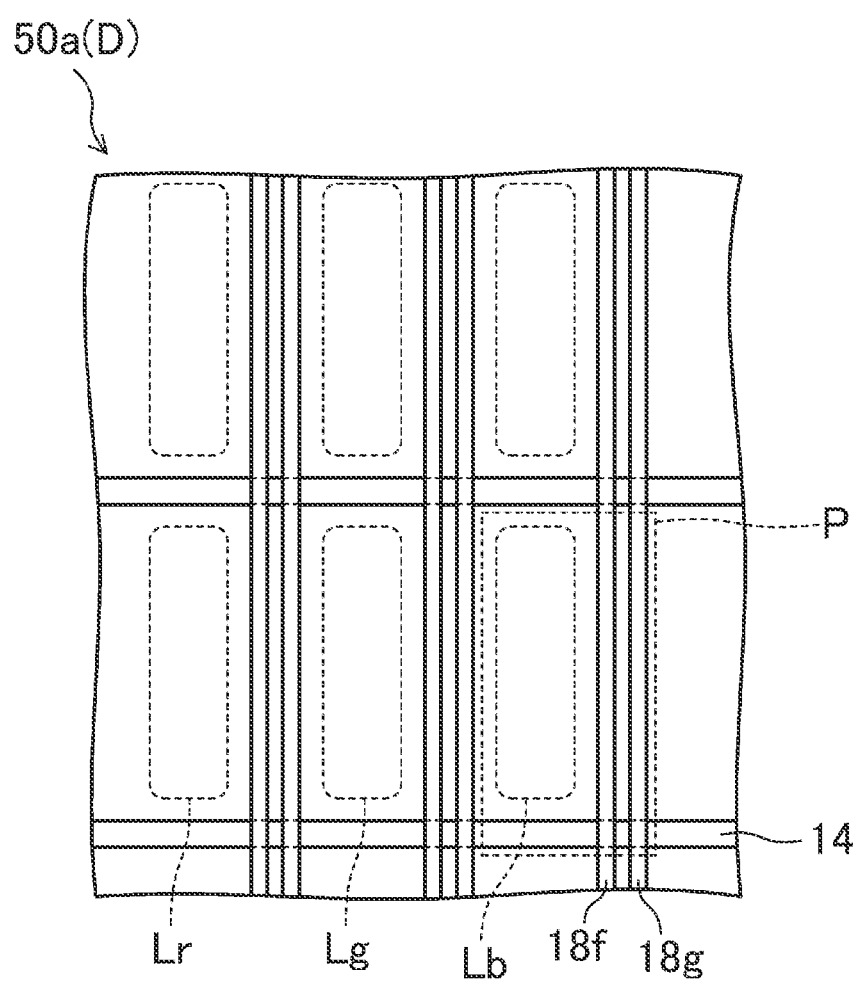
FIG. 2 is a plan view of a display region of the organic EL display device according to the first embodiment of the present invention.
Figure 3:
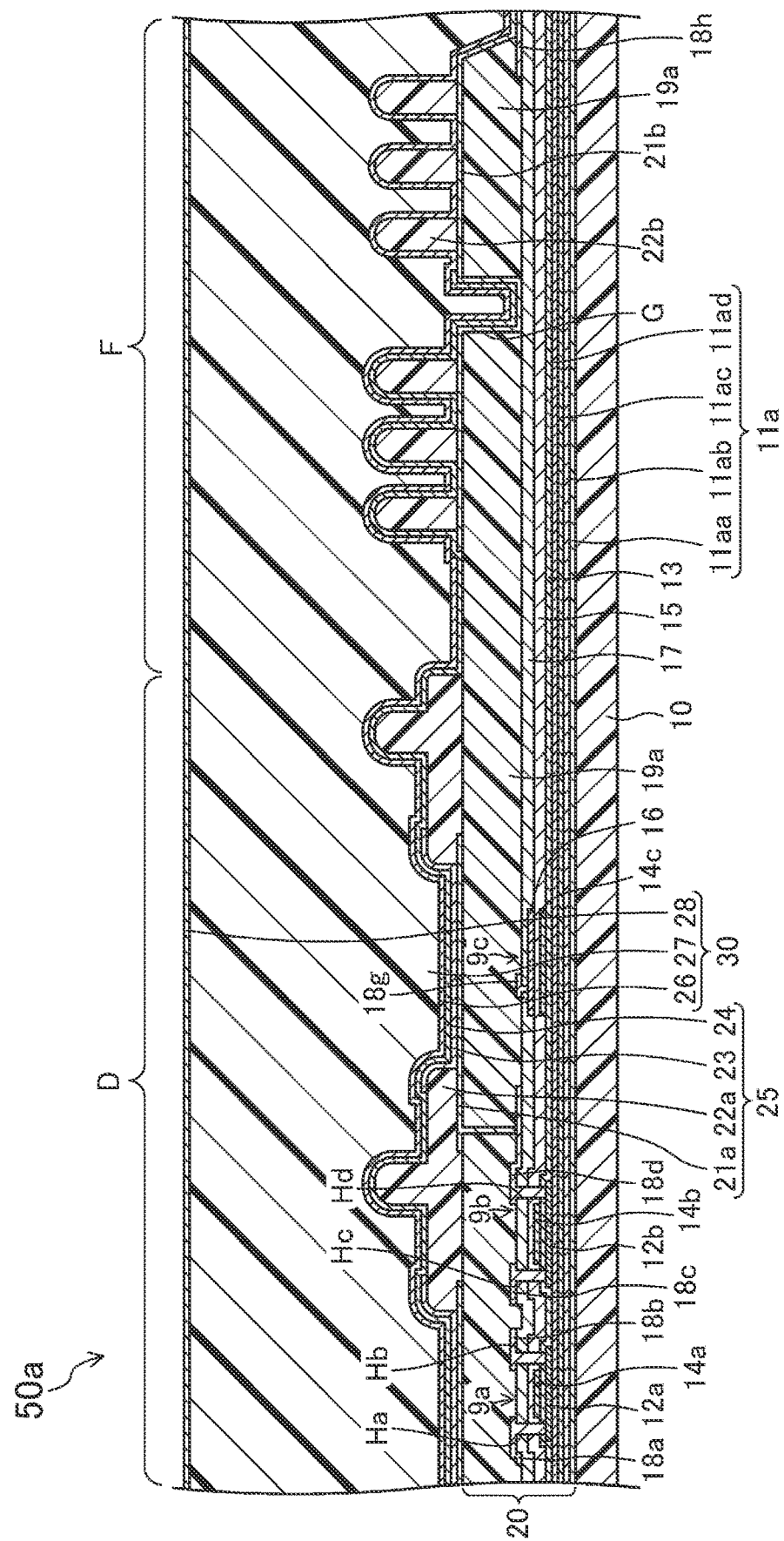
FIG. 3 is a sectional view of the organic EL display device, taken along line III-III in FIG. 1.
Figure 4:
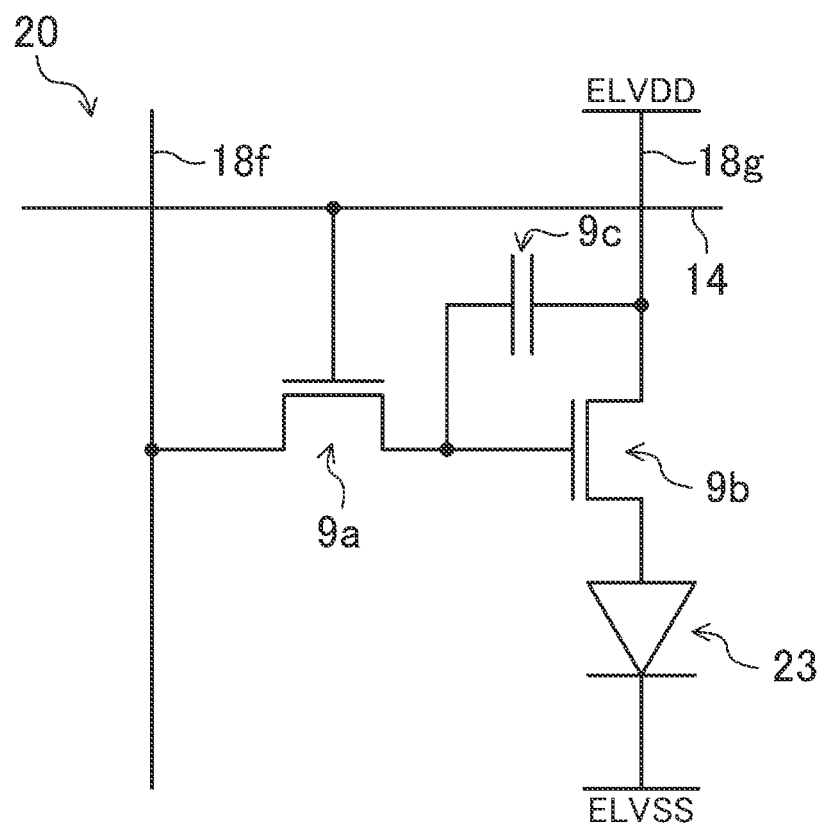
FIG. 4 is an equivalent circuit diagram of a TFT layer forming the organic EL display device according to the first embodiment of the present invention.
Figure 5:
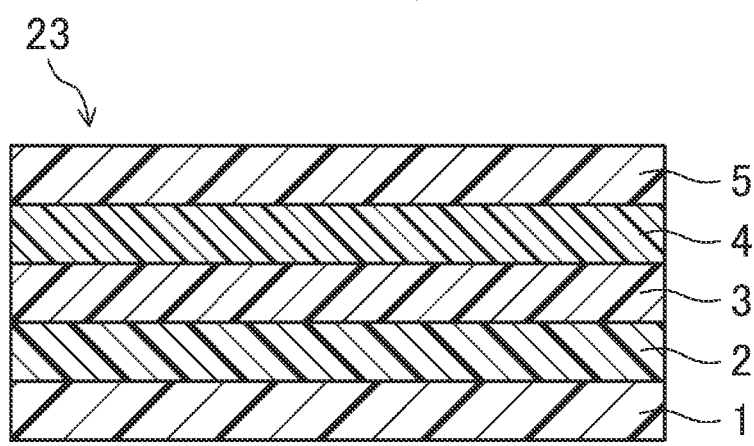
FIG. 5 is a sectional view of an organic EL layer forming the organic EL display device according to the first embodiment of the present invention.
Figure 6:
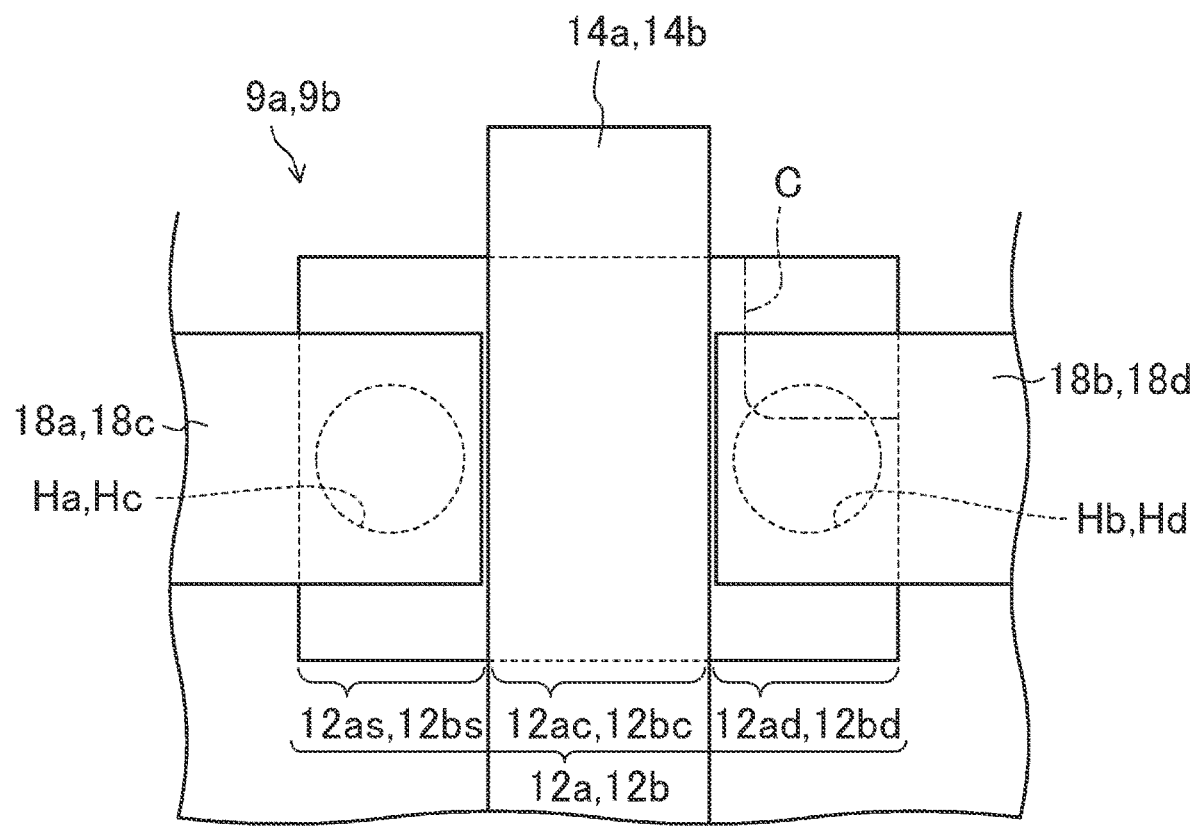
FIG. 6 is a plan view of a TFT forming the organic EL display device according to the first embodiment of the present invention.
Figure 7:
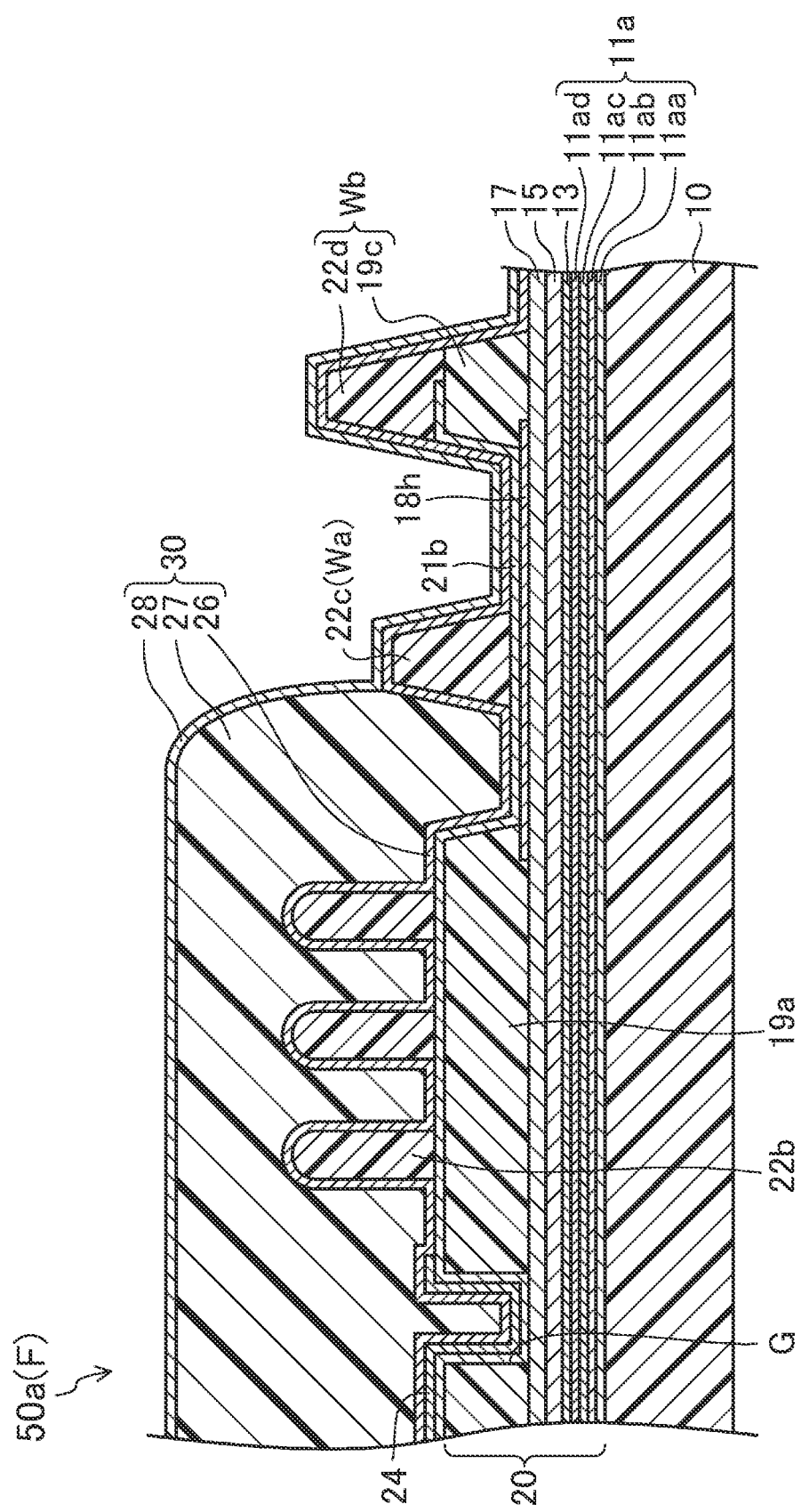
FIG. 7 is a sectional view of a frame region of the organic EL display device, taken along line VII-VII in FIG. 1.
Figure 8:
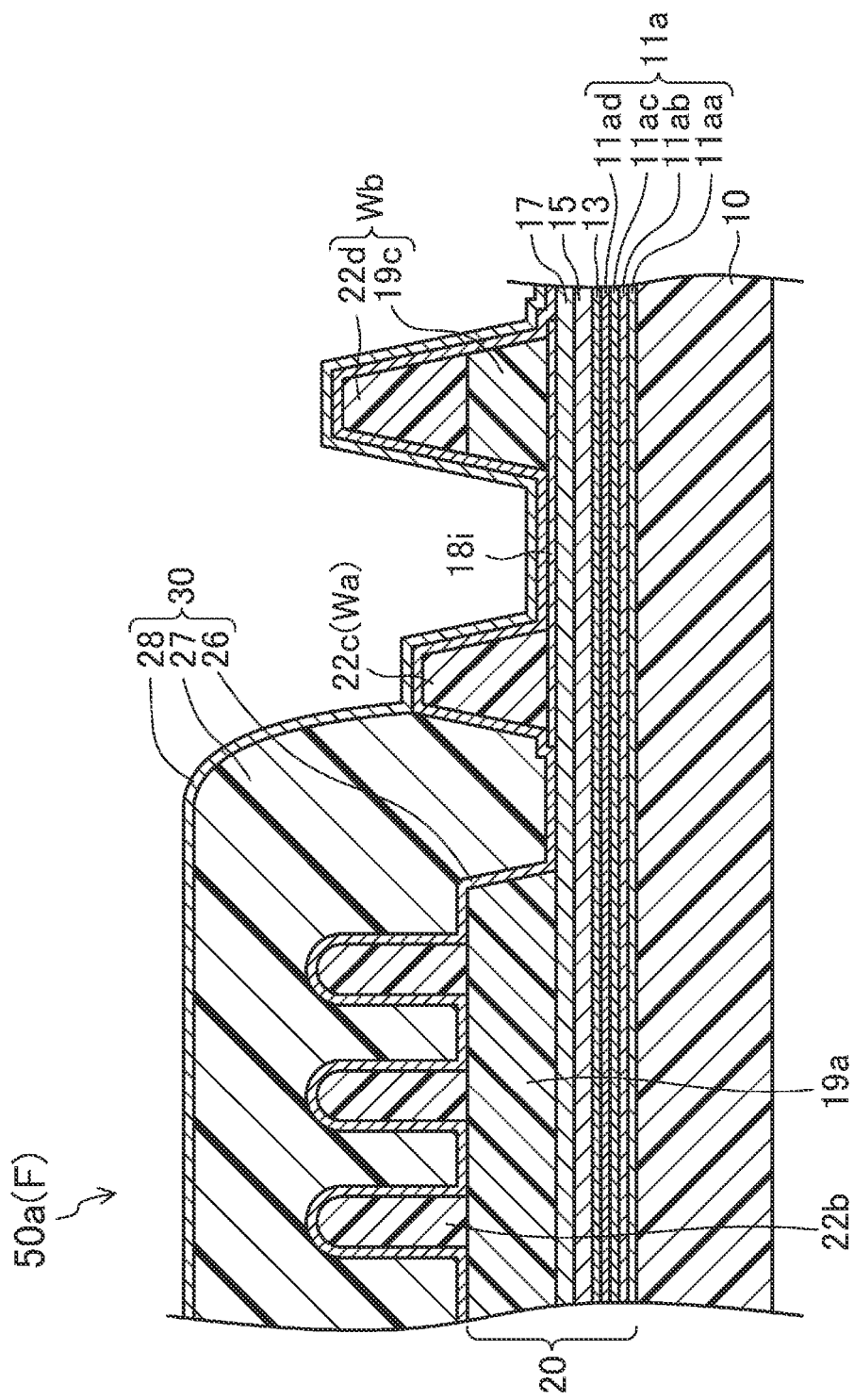
FIG. 8 is a sectional view of the frame region of the organic EL display device, taken along line VIII-VIII in FIG. 1.
Figure 9:
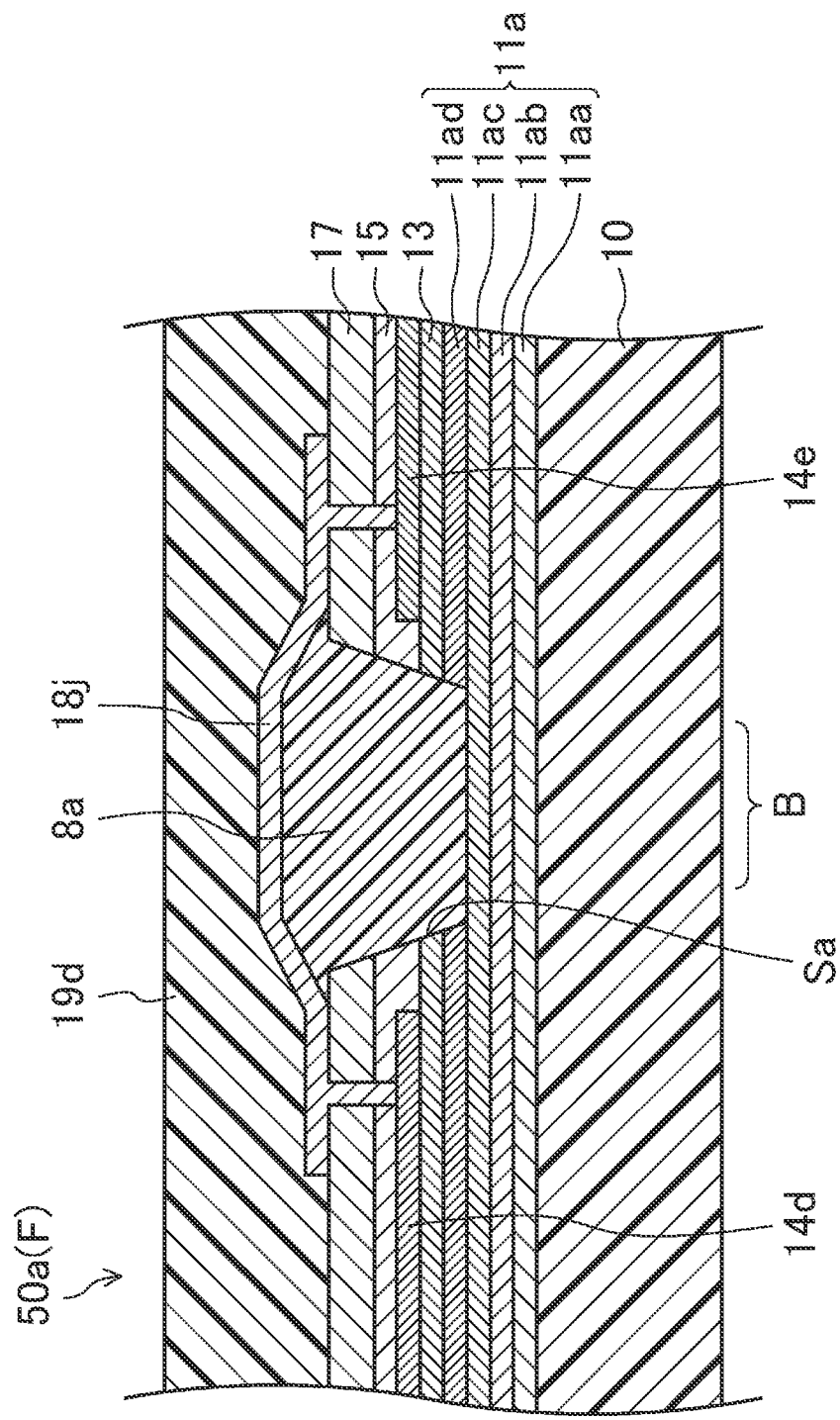
FIG. 9 is a sectional view of a bending portion in the frame region of the organic EL display device, taken along line IX-IX in FIG. 1.
Figure 10:
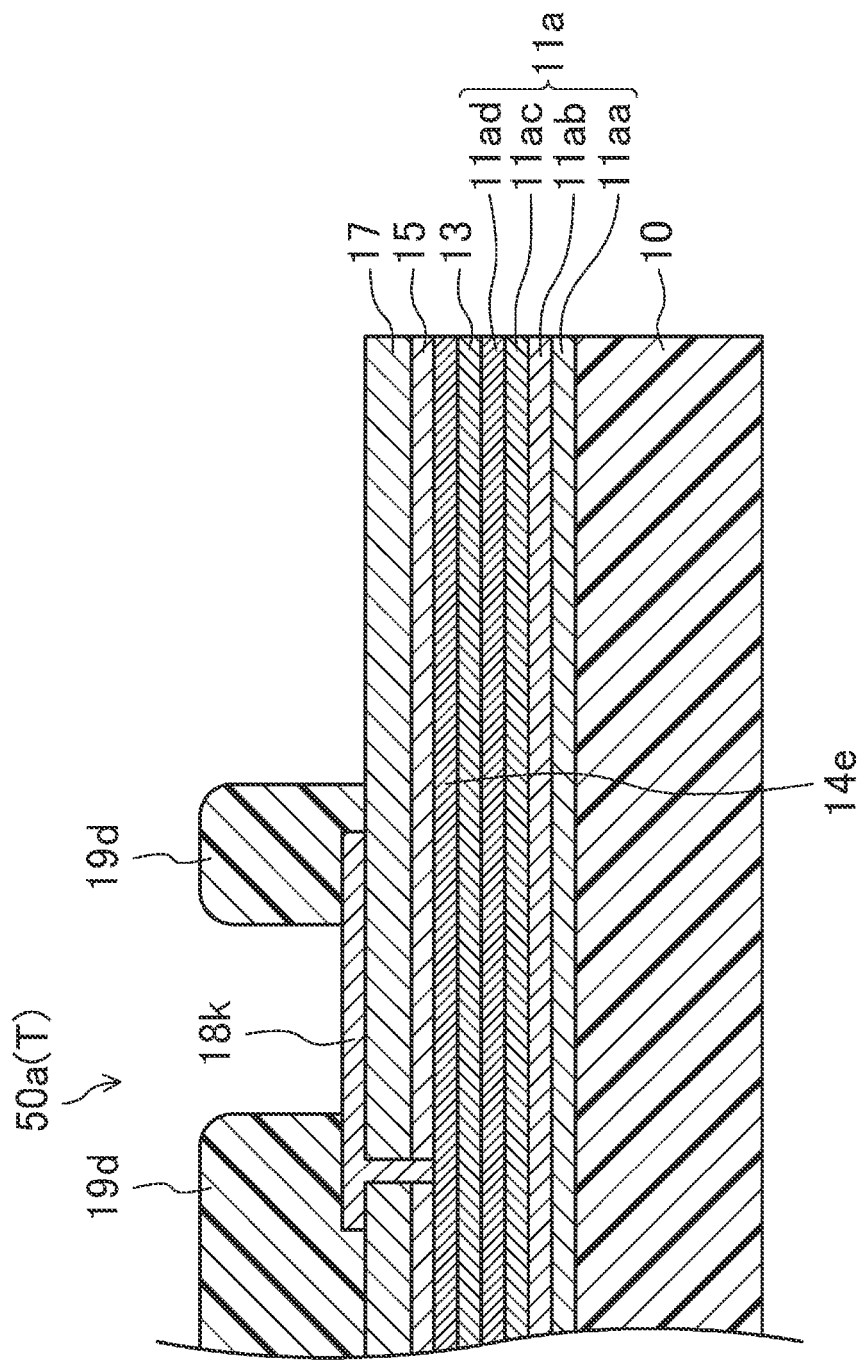
FIG. 10 is a sectional view of a terminal section in the frame region of the organic EL display device, taken along line X-X in FIG. 1.

FIGS. 1 to 12 illustrate a display device according to a first embodiment of the present invention. Each of the following embodiments describes an organic EL display device that includes an organic EL element as an example of a display device that includes a light-emitting element. FIG. 1 is a schematic plan view of the configuration of an organic EL display device 50a according to this embodiment. FIG. 2 is a plan view of a display region D of the organic EL display device 50a. FIG. 3 is a sectional view of the organic EL display device 50a, taken along line III-III in FIG. 1. FIG. 4 is an equivalent circuit diagram of a TFT layer 20 forming the organic EL display device 50a. FIG. 5 is a sectional view of an organic EL layer 23 forming the organic EL display device 50a. FIG. 6 is a plan view of a first TFT 9a and a second TFT 9b both forming the organic EL display device 50a. FIGS. 7 and 8 are sectional views of a frame region F of the organic EL display device 50a, taken along lines VII-VII and VIII-VIII in FIG. 1. FIG. 9 is a sectional view of a bending portion B in the frame region F of the organic EL display device 50a, taken along line IX-IX in FIG. 1. FIG. 10 is a sectional view of a terminal section T in the frame region F of the organic EL display device 50a, taken along line X-X in FIG. 1.

As illustrated in FIG. 1, the organic EL display device 50a includes the display region D having a rectangular shape and provided for image display, and includes the frame region F disposed in the form of a rectangular frame around the display region D. This embodiment describes, by way of example, that the display region D has a rectangular shape, which includes substantial rectangles, such as a rectangle having an arc-shaped side, a rectangle having an arc-shaped corner, and a rectangle having a cut in part of a side.

In the display region D are a plurality of sub-pixels P arranged in matrix, as illustrated in FIG. 2. In the display region D, a sub-pixel P having a red light-emission region Lr for red display, a sub-pixel P having a green light-emission region Lg for green display, and a sub-pixel P having a blue light-emission region Lb for blue display, for instance, are adjacent to each other, as illustrated in FIG. 2. Three adjacent sub-pixels P, having the red light-emission region Lr, the green light-emission region Lg, and the blue light-emission region Lb, constitute one pixel in the display region D for instance.

The frame region F has one side (right side in FIG. 1) on which the terminal section T is disposed. The frame region F also includes the bending portion B extending in one direction (the longitudinal direction of the drawing) between the display region D and the terminal section T, as illustrated in FIG. 1. The bending portion B is, for instance, 180° (i.e., U-shape) bendable along an axis in the longitudinal direction of the drawing. The frame region F also includes a substantially C-shaped trench G disposed in and penetrating a flattening film 19a, described later on, as illustrated in FIGS. 1, 3, and 7. The trench G herein has a substantial C-shape having an opening near the terminal section T in a plan view, as illustrated in FIG. 1.

As illustrated in FIGS. 3, 6, and 7, the organic EL display device 50a includes a resin substrate layer 10 as a resin substrate, a thin-film-transistor (TFT) layer 20 disposed on the resin substrate layer 10, an organic EL element 25 disposed on the TFT layer 20 as a light-emitting element and forming the display region D, and a sealing film 30 disposed over the organic EL element 25.

The resin substrate layer 10 is flexible and made of, but not limited to, polyimide resin.

The TFT layer 20 includes the following components, as illustrated in FIG. 3: a base coat film 11a disposed on the resin substrate layer 10; a plurality of first TFTs 9a, a plurality of second TFTs 9b and a plurality of capacitors 9c all disposed on the base coat film 11a; and the flattening film 19a disposed on the first TFTs 9a, the second TFTs 9b, and the capacitors 9c.

The TFT layer 20 includes the base coat film 11a, a semiconductor film, a gate insulating film 13, a first metal film, a first interlayer insulating film 15, a third metal film, a second interlayer insulating film 17, a second metal film, and the flattening film 19a all of which are sequentially stacked on the resin substrate layer 10, as illustrated in FIG. 3. Herein, the semiconductor film forms a first semiconductor layer 12a and others, described later on; moreover, the first metal film forms gate lines 14 and others, described later on; moreover, the third metal film forms an upper conductive layer 16 and others, described later on; moreover, the second metal film forms source lines 18f and others, described later on.

As illustrated in FIGS. 2 and 4, disposed in the TFT layer 20 are the plurality of gate lines 14 extending in parallel with each other in the lateral direction of the drawings. As illustrated in FIGS. 2 and 4, also disposed in the TFT layer 20 are the plurality of source lines 18f extending in parallel with each other in the longitudinal direction of the drawings. As illustrated in FIGS. 2 and 4, also disposed in the TFT layer 20 are a plurality of power-source lines 18g extending in parallel with each other in the longitudinal directions of the drawings. Each power-source line 18g is adjacent to each source line 18f, as illustrated in FIG. 2. In the TFT layer 20, the first TFT 9a, the second TFT 9b, and the capacitor 9c are disposed in each sub-pixel P in the display region D, as illustrated in FIG. 4.

The base coat film 11a includes a first base coat film 11aa, a second base coat film 11ab, a third base coat film 11ac, and a fourth base coat film 11ad sequentially stacked on the resin substrate layer 10, as illustrated in FIGS. 3 and 7 to 10. Herein, the first base coat film 11aa is composed of an about 300 nm thick inorganic insulating film made of, but not limited to, silicon oxide. Moreover, the second base coat film 11ab is composed of an about 100 nm thick inorganic insulating film made of, but not limited to, silicon nitride. Moreover, the third base coat film 11ac is composed of an about 100 nm thick semiconductor film, such as an amorphous silicon film. Moreover, the fourth base coat film 11ad is composed of an about 300 nm thick inorganic insulating film made of, but not limited to, silicon oxide. The fourth base coat film 11ad, the uppermost layer of the base coat film 11a, is disposed immediately on the third base coat film 11ac. It is noted that the third base coat film 11ac needs to be disposed at least all over the display region D.

The first TFT 9a in each sub-pixel P is electrically connected to the corresponding gate line 14 and source line 18f, as illustrated in FIG. 4. The first TFT 9a includes the following components sequentially disposed on the base coat film 11a, as illustrated in FIG. 3: the semiconductor layer 12a, the gate insulating film 13, a gate electrode 14a, the first interlayer insulating film 15, the second interlayer insulating film 17, and source and drain electrodes 18a and 18b. Herein, the semiconductor layer 12a is composed of the aforementioned semiconductor film, and as illustrated in FIG. 3, this layer is disposed in the form of an island on the base coat film 11a. The semiconductor layer 12a has a channel region 12ac, and source and drain regions 12as and 12ad with the channel region 12ac interposed therebetween, as illustrated in FIG. 6. Moreover, the gate insulating film 13 is disposed over the semiconductor layer 12a, as illustrated in FIG. 3. Moreover, the gate electrode 14a is composed of the first metal film, and as illustrated in FIG. 3, this electrode overlaps, on the gate insulating film 13, the channel region 12ac of the semiconductor layer 12a. Moreover, the first interlayer insulating film 15 and the second interlayer insulating film 17 are sequentially disposed over the gate electrode 14a, as illustrated in FIG. 3. Moreover, the source electrode 18a and the drain electrode 18b are composed of the second metal film, and as illustrated in FIGS. 3 and 6, these electrodes are spaced from each other on the second interlayer insulating film 17. As illustrated in FIGS. 3 and 6, the source electrode 18a is electrically connected to the source region 12as of the semiconductor layer 12a via a first contact hole Ha disposed in the stack of the gate insulating film 13, first interlayer insulating film 15, and second interlayer insulating film 17. As illustrated in FIGS. 3 and 6, the drain electrode 18b is electrically connected to the drain region 12ad of the semiconductor layer 12a via a second contact hole Hb disposed in the stack of the gate insulating film 13, first interlayer insulating film 15, and second interlayer insulating film 17.

The gate insulating film 13, the first interlayer insulating film 15, and the second interlayer insulating film 17 are composed of an inorganic insulating monolayer film of, for instance, silicon nitride, silicon oxide, or silicon oxide nitride, or are composed of an inorganic insulating laminated film of these materials.

The semiconductor layer 12a and a semiconductor layer 12b, which will be described later on, are composed of an In—Ga—Zn—O oxide semiconductor. An In—Ga—Zn—O semiconductor herein is a ternary oxide of indium (In), gallium (Ga), and zinc (Zn), and may contain In, Ga, and Zn at any ratio (composition ratio). An In—Ga—Zn—O semiconductor may be amorphous or crystalline. For a crystalline substance, a crystalline In—Ga—Zn—O semiconductor is preferably used whose c-axis is nearly perpendicular to a layer surface. Another kind of oxide semiconductor may be included instead of an In—Ga—Zn—O semiconductor. For instance, an In—Sn—Zn—O semiconductor (e.g., $In_2O_3$—$SnO_2$—ZnO, InSnZnO) may be included. An In—Sn—Zn—O semiconductor is a ternary oxide of indium (In), tin (Sn), and zinc (Zn). Moreover, an oxide semiconductor may include, but not limited to, an In—Al—Zn—O semiconductor, an In—Al—Sn—Zn—O semiconductor, a Zn—O semiconductor, an In—Zn—O semiconductor, a Zn—Ti—O semiconductor, a Cd—Ge—O semiconductor, a Cd—Pb—O semiconductor, a cadmium oxide (CdO), a Mg—Zn—O semiconductor, an In—Ga—Sn—O semiconductor, an In—Ga—O semiconductor, a Zr—In—Zn—O semiconductor, a Hf—In—Zn—O semiconductor, an Al—Ga—Zn—O semiconductor, a Ga—Zn—O semiconductor, an In—Ga—Zn—Sn—O semiconductor, $InGaO_3(ZnO)_5$, a magnesium zinc oxide ($Mg_xZn_{1-x}O$), and a cadmium zinc oxide ($Cd_xZn^{1-x}O$). A usable Zn—O semiconductor is ZnO with one or more kinds of impurity element selected from among, but not limited to, a Group I element, a Group XIII element, a Group XIV element, a Group XV element, and a Group XVII being added thereto, in the form of an amorphous substance, a polycrystalline substance, or a crystallite substance containing amorphous and polycrystalline substances. Alternatively, a usable Zn—O semiconductor is ZnO without any impurity elements being added thereto. In some cases, the semiconductor layer 12a and the semiconductor layer 12b each can have a chipped portion C (chain double-dashed line), resulting from cleaning for instance, at their corners, and the chipped portion C can overlap the second contact hole Hb, as illustrated in FIG. 6. Even in these cases, etching for forming the second contact hole Hb stops at the third base coat film 11ac, because the base coat film 11a includes the third base coat film 11ac composed of an amorphous silicon film. It is noted that although composed of an oxide semiconductor in this embodiment, the semiconductor layer 12a and the semiconductor layer 12b may be composed of another semiconductor film of, but not limited to, amorphous silicon or polysilicon.

The second TFT 9b in each sub-pixel P is electrically connected to the corresponding first TFT 9a and power-source line 18g, as illustrated in FIG. 4. The second TFT 9b includes the following components sequentially disposed on the base coat film 11a, as illustrated in FIG. 3: the semiconductor layer 12b, the gate insulating film 13, a gate electrode 14b, the first interlayer insulating film 15, the second interlayer insulating film 17, and source and drain electrodes 18c and 18d. Herein, the semiconductor layer 12b is composed of the aforementioned semiconductor film, and as illustrated in FIG. 3, this layer is in the form of an island on the base coat film 11a. The semiconductor layer 12b has a channel region 12bc, and source and drain regions 12bs and 12bd with the channel region 12bc interposed therebetween, as illustrated in FIG. 6. Moreover, the gate insulating film 13 is disposed over the semiconductor layer 12b, as illustrated in FIG. 3. Moreover, the gate electrode 14b is composed of the first metal film, and as illustrated in FIG. 3, this electrode overlaps, on the gate insulating film 13, the channel region of the semiconductor layer 12b. Moreover, the first interlayer insulating film 15 and the second interlayer insulating film 17 are sequentially disposed over the gate electrode 14b, as illustrated in FIG. 3. Moreover, the source electrode 18c and the drain electrode 18d are composed of the second metal film, and as illustrated in FIGS. 3 and 6, these electrodes are spaced from each other on the second interlayer insulating film 17. As illustrated in FIGS. 3 and 6, the source electrode 18c is electrically connected to the source region 12bs of the semiconductor layer 12b via a first contact hole Hc disposed in the stack of the gate insulating film 13, first interlayer insulating film 15, and second interlayer insulating film 17. As illustrated in FIGS. 3 and 6, the drain electrode 18d is electrically connected to the drain region 12bd of the semiconductor layer 12b via a second contact hole Hd disposed in the stack of the gate insulating film 13, first interlayer insulating film 15, and second interlayer insulating film 17.

The capacitor 9c in each sub-pixel P is electrically connected to the corresponding first TFT 9a and power-source line 18g, as illustrated in FIG. 4. The capacitor 9c includes the following components, as illustrated in FIG. 3: a lower conductive layer 14c composed of the first metal film; the first interlayer insulating film 15 disposed over the lower conductive layer 14c; and an upper conductive layer 16 overlapping, on the first interlayer insulating film 15, the lower conductive layer 14c. The upper conductive layer 16 is electrically connected to the power-source line 18g via a contact hole disposed in the second interlayer insulating film 17, as illustrated in FIG. 3.

The flattening film 19a is made of organic resin material, such as polyimide resin.

The organic EL element 25 includes the following components sequentially disposed on the flattening film 19a, as illustrated in FIG. 3: a plurality of first electrodes 21a, an edge cover 22a, a plurality of organic EL layers 23, and a second electrode 24.

The first electrodes 21a are arranged in matrix on the flattening film 19a so as to correspond to the sub-pixels P, as illustrated in FIG. 3. Each first electrode 21a is electrically connected to the drain electrode 18d of each second TFT 9b via a contact hole disposed in the flattening film 19a, as illustrated in FIG. 3. The first electrodes 21a are capable of injecting holes (positive holes) into the organic EL layers 23. The first electrodes 21a are more preferably made of material having a large work function in order to improve the efficiency of hole injection into the organic EL layers 23. The first electrodes 21a are made of metal material, including silver (Ag), aluminum (Al), vanadium (V), cobalt (Co), nickel (Ni), tungsten (W), gold (Au), titanium (Ti), ruthenium (Ru), manganese (Mn), indium (In), ytterbium (Yb), lithium fluoride (LiF), platinum (Pt), palladium (Pd), molybdenum (Mo), iridium (Ir), and tin (Sn). In some cases, the first electrodes 21a may be made of alloy of, for instance, astatine (At) and astatine oxide ($AtO_2$). Alternatively, the first electrodes 21a may be made of conductive oxide, such as tin oxide (SnO), zinc oxide (ZnO), indium tin oxide (ITO), or indium zinc oxide (IZO). Alternatively, the first electrodes 21a may be composed of a stack of multiple layers made of the above materials. Here, examples of a compound material having a large work function include an indium tin oxide (ITO) and an indium zinc oxide (IZO).

The edge cover 22a is disposed in lattice so as to cover the perimeter of each first electrode 21a, as illustrated in FIG. 3. The edge cover 22a is made of positive photosensitive resin, such as polyimide resin, acrylic resin, polysiloxane resin, or novolak resin.

The plurality of organic EL layers 23 are disposed on the individual first electrodes 21a and arranged in matrix so as to correspond to the plurality of sub-pixels P, as illustrated in FIG. 3. Each organic EL layer 23 includes the following layers sequentially disposed on the first electrode 21a, as illustrated in FIG. 5: a hole injection layer 1, a hole transport layer 2, a light-emitting layer 3, an electron transport layer 4, and an electron injection layer 5.

The hole injection layer 1 is also called an anode buffer layer, and is capable of bringing the energy levels of the first electrode 21a and organic EL layer 23 close to each other to improve the efficiency of hole injection from the first electrode 21a into the organic EL layer 23. Examples of the material of the hole injection layer 1 include a triazole derivative, an oxadiazole derivative, an imidazole derivative, a polyarylalkane derivative, a pyrazoline derivative, a phenylenediamine derivative, an oxazole derivative, a styrylanthracene derivative, a fluorenone derivative, a hydrazone derivative, and a stilbene derivative.

The hole transport layer 2 is capable of improving the efficiency of hole transport from the first electrode 21a to the organic EL layer 23. Examples of the material of the hole transport layer 2 include a porphyrin derivative, an aromatic tertiary amine compound, a styrylamine derivative, polyvinylcarbazole, poly-p-phenylenevinylene, polysilane, a triazole derivative, an oxadiazole derivative, an imidazole derivative, a polyarylalkane derivative, a pyrazoline derivative, a pyrazolone derivative, a phenylenediamine derivative, an arylamine derivative, an amine-substituted chalcone derivative, an oxazole derivative, a styrylanthracene derivative, a fluorenone derivative, a hydrazone derivative, a stilbene derivative, hydrogenated amorphous silicon, hydrogenated amorphous silicon carbide, zinc sulfide, and zinc selenide.

The light-emitting layer 3 is a region where holes and electrons are respectively injected from the first and second electrodes 21a and 24 applied with voltage, and where the holes and electrons rejoin. The light-emitting layer 3 is made of material having high efficiency of light emission. Examples of the material of the light-emitting layer 3 include a metal oxinoid compound [8-hydroxyquinoline metal complex], a naphthalene derivative, an anthracene derivative, a diphenylethylene derivative, a vinyl acetone derivative, a triphenylamine derivative, a butadiene derivative, a coumarin derivative, a benzoxazole derivative, an oxadiazole derivative, an oxazole derivative, a benzimidazole derivative, a thiadiazole derivative, a benzthiazole derivative, a styryl derivative, a styrylamine derivative, a bisstyrylbenzene derivative, a trisstyrilbenzene derivative, a perylene derivative, a perynone derivative, an aminopyrene derivative, a pyridine derivative, a rhodamine derivative, an acridine derivative, phenoxazone, a quinacridone derivative, rubrene, poly-p-phenylenevinylene, and polysilane.

The electron transport layer 4 is capable of moving electrons to the light-emitting layer 3 efficiently. The electron transport layer 4 is composed of an organic compound, including an oxadiazole derivative, a triazole derivative, a benzoquinone derivative, a naphthoquinone derivative, an anthraquinone derivative, a tetracyanoanthraquinodimethane derivative, a diphenoquinone derivative, a fluorenone derivative, a silole derivative, and a metal oxinoid compound.

The electron injection layer 5 is capable of bringing the energy levels of the second electrode 24 and organic EL layer 23 close to each other to improve the efficiency of electron injection from the second electrode 24 into the organic EL layer 23. This function can lower voltage for driving the organic EL element 25. The electron injection layer 5 is also called a cathode buffer layer. Herein, examples of the material of the electron injection layer 5 include an inorganic alkali compound (e.g., LiF or lithium fluoride, $MgF_2$ or magnesium fluoride, $CaF_2$ or calcium fluoride, $SrF_2$ or strontium fluoride, and $BaF_2$ or barium fluoride), an aluminum oxide ($Al_2O_3$), and a strontium oxide (SrO).

The second electrode 24 is disposed over the individual organic EL layers 23 and the edge cover 22a, as illustrated in FIG. 3. The second electrode 24 is capable of injecting electrons into the organic EL layers 23. The second electrode 24 is more preferably made of material having a small work function, in order to improve the efficiency of electron injection into the organic EL layers 23. Here, examples of the material of the second electrode 24 include silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). Alternatively, the second electrode 24 may be made of, for instance, alloy of magnesium (Mg) and copper (Cu), alloy of magnesium (Mg) and silver (Ag), alloy of sodium (Na) and potassium (K), alloy of astatine (At) and astatine oxide ($AtO_2$), alloy of lithium (Li) and aluminum (Al), alloy of lithium (Li), calcium (Ca) and aluminum (Al), or alloy of lithium fluoride (LiF), calcium (Ca) and aluminum (Al). Alternatively, the second electrode 24 may be made of conductive oxide, such as tin oxide (SnO), zinc oxide (ZnO), indium tin oxide (ITO), or indium zinc oxide (IZO), Alternatively, the second electrode 24 may be composed of a stack of multiple layers made of the above materials. Examples of a material having a small work function include magnesium (Mg), lithium (Li), lithium fluoride (LiF), magnesium (Mg)-copper (Cu), magnesium (Mg)-silver (Ag), sodium (Na)-potassium (K), lithium (Li)-aluminum (Al), lithium (Li)-calcium (Ca)-aluminum (Al), and lithium fluoride (LiF)-calcium (Ca)-aluminum (Al).

The sealing film 30 includes the following films, as illustrated in FIGS. 3, 7, and 8: a first inorganic insulating film 26 disposed over the second electrode 24; an organic film 27 disposed on the first inorganic film 26; and a second inorganic insulating film 28 disposed over the organic film 27. The sealing film 30 is capable of protecting the organic EL layers 23 from moisture and oxygen. The first inorganic insulating film 26 and the second inorganic insulating film 28 are made of inorganic material, such as silicon oxide ($SiO_2$), aluminum oxide ($Al_2O_3$), silicon nitride (SiNx, where x is a positive number; an example of silicon nitride is $Si_3N_4$ or trisilicon tetranitride), or silicon carbonitride (SiCN). The organic film 27 is made of organic material, such as acrylic resin, polyurea resin, parylene resin, polyimide resin, or polyamide resin.

As illustrated in FIGS. 1, 7, and 8, the organic EL display device 50a includes, in the frame region F, a first barrier wall Wa disposed in the form of a frame outside the trench G, and a second barrier wall Wb disposed in the form of a frame around the first barrier wall Wa.

The first barrier wall Wa overlaps the edge of the organic film 27 of the sealing film 30, as illustrated in FIGS. 7 and 8, and is designed to prevent ink spread in the organic film 27 of the sealing film 30. The first barrier wall Wa is composed of a resin layer 22c made of the same material and disposed in the same layer as the edge cover 22a, as illustrated in FIGS. 7 and 8. Moreover, the second barrier wall Wb includes the following layers, as illustrated in FIGS. 7 and 8: a lower resin layer 19c made of the same material and disposed in the same layer as the flattening film 19a; and an upper resin layer 22d disposed on the lower resin layer 19c with a third conductive layer 21b (described later on) interposed therebetween. The upper resin layer 22d is made of the same material and disposed in the same layer as the edge cover 22a.

As illustrated in FIGS. 1 and 7, the organic EL display device 50a includes, in the frame region F, a first conductive layer 18h having a substantial C-shape in a plan view and disposed outside the trench G. The first conductive layer 18h is electrically connected to a terminal to which a low power-source voltage (ELVSS) is input, in the terminal section T. The first conductive layer 18h is also electrically connected to the second electrode 24 via the third conductive layer 21b, as illustrated in FIGS. 1 and 7. The first conductive layer 18h is composed of the second metal film.

Moreover, the third conductive layer 21b is made of the same material and disposed in the same layer as the first electrodes 21a. Moreover, TFTs constituting a gate-signal control circuit and light-emission control circuit are disposed near the display region D and the first conductive layer 18h, on the upper and lower sides of the trench G in FIG. 1.

As illustrated in FIGS. 1 and 8, the organic EL display device 50a also includes a second conductive layer 18i disposed in the form of a band on one side of the frame region F along the terminal section T. The second conductive layer 18i is electrically connected to a terminal to which a high power-source voltage (ELVDD) is input, in the terminal section T. The second conductive layer 18i overlaps the first barrier wall Wa and the second barrier wall Wb, as illustrated in FIGS. 1 and 8. The second conductive layer 18i is also electrically connected to the plurality of power-source lines 18g, disposed in the display region D. The second conductive layer 18i is composed of the second metal film.

As illustrated in FIGS. 3, 7, and 8, the organic EL display device 50a also includes, in the frame region F, a plurality of peripheral photo spacers 22b in the form of islands protruding upward between the display region D and the first barrier wall Wa. The peripheral photo-spacers 22b are made of the same material and disposed in the same layer as the edge cover 22a. The edge cover 22a has a surface provided with an upward protrusion, and this protrusion is an island-shaped pixel photo-spacer.

As illustrated in FIG. 9, the organic EL display device 50a also includes the following at the bending portion B in the frame region F: a first resin layer 8a filled in a bending-portion slit Sa, which is disposed in the base coat film 11a, the gate insulating film 13, the first interlayer insulating film 15 and the second interlayer insulating film 17; a plurality of routed wires 18j disposed on the first resin layer 8a; and a protective layer 19d disposed over the individual routed wires 18j.

As illustrated in FIG. 9, the bending-portion slit Sa penetrates the upper layer of the base coat film 11a, the gate insulating film 13, the first interlayer insulating film 15 and the second interlayer insulating film 17, thus being open upward, and is in the form of a groove penetrating in the direction where the bending portion B extends, so as to expose the upper surface of the third base coat film 11ac.

As illustrated in FIG. 9, a plurality of first lead wires 14d composed of the first metal film extend in parallel with each other in a direction orthogonal to the direction where the bending portion B extends. The first lead wires 14d are located closer to the display region D than the bending-portion slit Sa is (i.e., on the left side of the drawing). The first lead wires 14d are, at their portions close to the display region D, electrically connected to display wires (e.g., the gate lines 14, the source lines 18f, and the power-source lines 18g) extending in the display region D.

As illustrated in FIG. 9, a plurality of second lead wires 14e composed of the first metal film extend in parallel with each other in the direction orthogonal to the direction where the bending portion B extends. The second lead wires 14e are located closer to the terminal section T than the bending-portion slit Sa is (i.e., on the right side of the drawing). As illustrated in FIG. 10, the second lead wires 14e are, at their portions close to the terminal section T, individually electrically connected to a plurality of terminals 18k disposed in the terminal section T, via contact holes disposed in the first interlayer insulating film 15 and the second interlayer insulating film 17.

The first resin layer 8a is made of organic resin material, such as polyimide resin.

The routed wires 18j are composed of the second metal film. The routed wires 18j extend in parallel with each other in the direction orthogonal to the direction where the bending portion B extends, from a location adjacent to the display region D toward the terminal section T. The routed wires 18j extend astride the first resin layer 8a, as illustrated in FIG. 9. Here, the routed wires 18j are, at their portions close to the display region D, electrically connected to the respective first lead wires 14d via contact holes disposed in the first and second interlayer insulating films 15 and 17, as illustrated in FIG. 9. Moreover, the routed wires 18j are, at their portions close to the terminal section T, electrically connected to the respective second lead wires 14e via contact holes disposed in the first and second interlayer insulating films 15 and 17, as illustrated in FIG. 9.

The protective layer 19d is made of the same material and disposed in the same layer as the flattening film 19a.

Figure 11:
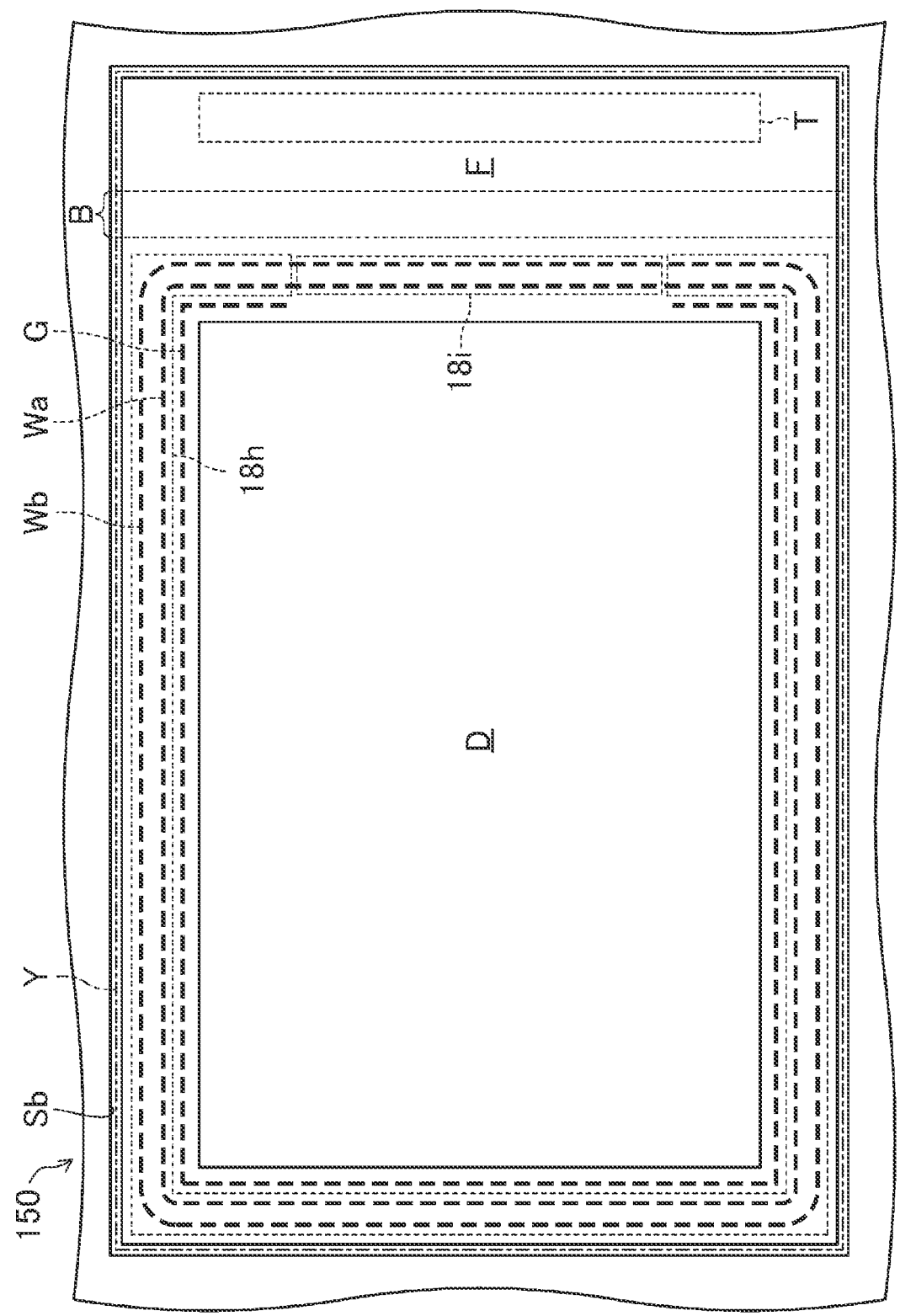
FIG. 11 is a plan view of a motherboard for producing a modification of the organic EL display device according to the first embodiment of the present invention.
Figure 12:
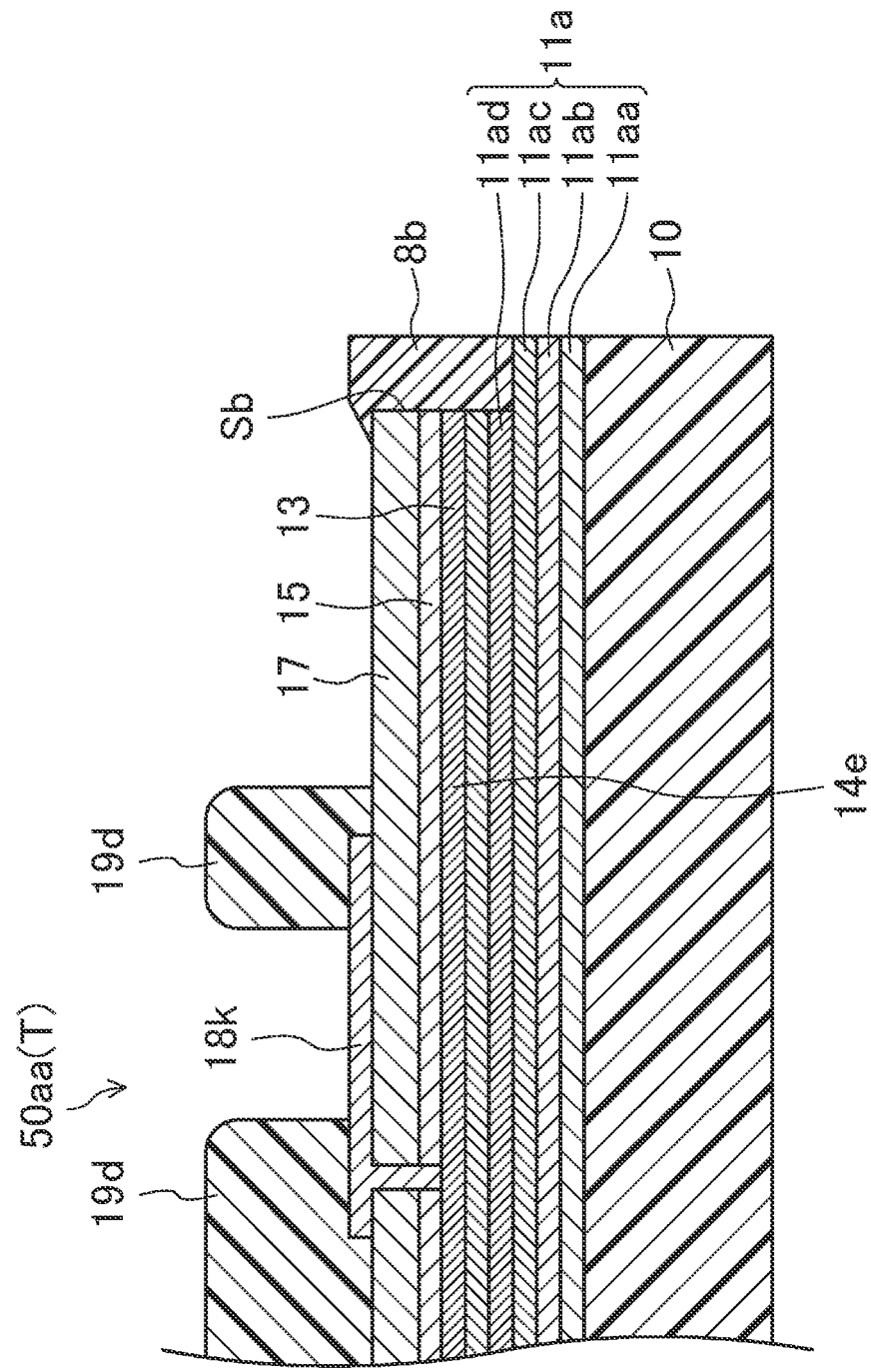
FIG. 12 is a sectional view of the terminal section in the frame region of the modification of the organic EL display device according to the first embodiment of the present invention, and corresponds to FIG. 10.

In this embodiment, the organic EL display device 50a includes the base coat film 11a, the gate insulating film 13, the first interlayer insulating film 15, and the second interlayer insulating film 17, all of which extend to the perimeter surface of the resin substrate layer 10. In some embodiments, an organic EL display device 50aa may be provided, with the upper layer of the base coat film 11a, the gate insulating film 13, the first interlayer insulating film 15 and the second interlayer insulating film 17 being removed at the edge of the resin substrate layer 10, as illustrated in FIG. 12. FIG. 11 is a plan view of a motherboard 150 for producing the organic EL display device 50aa, which is a modification of the organic EL display device 50a. FIG. 12 is a sectional view of the terminal section T in the frame region F of the organic EL display device 50aa, and corresponds to FIG. 10.

To be specific, FIG. 11 illustrates that the motherboard 150 with the organic EL display device 50aa arranged in matrix has an edge-portion slit Sb that is disposed in the base coat film 11a, the gate insulating film 13, the first interlayer insulating film 15 and the second interlayer insulating film 17, along a frame-shaped cutting line Y for cutting out the organic EL display device 50aa. The edge-portion slit Sb penetrates the upper layer of the base coat film 11a, the gate insulating film 13, the first interlayer insulating film 15 and the second interlayer insulating film 17, thus being open upward, and is provided so as to expose the upper surface of the third base coat film 11ac. The edge-portion slit Sb is filled with a second resin layer 8b made of the same material and disposed in the same layer as the first resin layer 8a. Hence, as illustrated in FIG. 12, the third base coat film 11ac and the second resin layer 8b are in contact with each other at the edge of the resin substrate layer 10 of each organic EL display device 50aa as divided along the cutting line Y. This organic EL display device 50aa, which includes a thin inorganic insulating film overlapping the cutting line Y, can be easily cut out from the motherboard 150.

In each sub-pixel P, inputting a gate signal to the first TFT 9a through the gate line 14 to turn on the first TFT 9a, followed by applying a predetermined voltage corresponding to a data signal to the gate electrode 14b of the second TFT 9b and to the capacitor 9c through the source line 18f to supply a current defined based on a gate voltage across the second TFT 9b and coming from the power-source line 18g causes the light-emitting layer 3 of the organic EL layer 23 to emit light. This enables the organic EL display device 50a to display an image. In the organic EL display device 50a, the gate voltage across the second TFT 9b is maintained by the capacitor 9c even when the first TFT 9a is turned off; hence, the light-emitting layer 3 keeps light emission until a gate signal in the next frame is input.

A method for manufacturing the organic EL display device 50a according to this embodiment will be described. The method for manufacturing the organic EL display device 50a in this embodiment includes a step of forming a TFT layer, a step of forming an organic EL element, and a step of forming a sealing film.

Step of Forming TFT Layer

Firstly, the base coat film 11a is formed by continuously sequentially forming a silicon oxide film, a silicon nitride film, an amorphous silicon film, and a silicon oxide film onto the resin substrate layer 10, which is on a glass substrate for instance, through plasma chemical vapor deposition (CVD) or other processes.

Then, the TFT layer 20 is formed by forming, through a well-known method, the first TFTs 9a, the second TFTs 9b, the capacitors 9c, and the flattening film 19a in the base coat film 11a.

Herein, forming the first TFTs 9a and the second TFTs 9b includes, before forming the source electrodes 18a and other components, forming the bending-portion slit Sa at the bending portion B in the frame region F by removing the stack of the base coat film 11a, gate insulating film 13, first interlayer insulating film 15, and second interlayer insulating film 17 through dry etching, followed by forming the first resin layer 8a so as to fill the bending-portion slit Sa. Then, the routed wires 18j are formed at the same time as forming the source electrodes 18a and other components.

Step of Forming Organic EL Element

The organic EL element 25 is formed by forming, through a well-known method, the first electrodes 21a, the edge cover 22a, the organic EL layers 23 (i.e., the hole injection layers 1, the hole transport layers 2, the light-emitting layers 3, the electron transport layers 4, and the electron injection layers 5), and the second electrode 24 onto the flattening film 19a of the TFT layer 20 as formed in the step of forming a TFT layer.

Step of Forming Scaling Film

Firstly, the first inorganic insulating film 26 is formed by forming, through plasma CVD using a mask, inorganic insulating films, such as a silicon nitride film, a silicon oxide film, and a silicon oxide nitride film, onto the substrate surface provided with the organic EL element 25 as formed in the step of forming an organic EL element.

Then, the organic film 27 is formed by forming, through an ink-jet method for instance, a film of organic resin material, such as acrylic resin, onto the substrate surface provided with the first inorganic insulating film 26.

Furthermore, through plasma CVD using a mask, inorganic insulating films, such as a silicon nitride film, a silicon oxide film, and a silicon oxide nitride film, are formed onto the substrate provided with the organic film 27, to form the second inorganic insulating film 28, thus forming the sealing film 30.

Finally, a protective sheet (not shown) is attached onto the substrate surface provided with the sealing film 30, followed by laser light irradiation from a surface of the base substrate 10 adjacent to the glass substrate to peel the glass substrate off from the lower surface of the base substrate 10, followed by attachment of a protective sheet (not shown) onto the lower surface of the base substrate 10 with the glass substrate peeled off therefrom.

The organic EL display device 50a according to this embodiment can be manufactured through these process steps.

As described above, the organic EL display device 50a according to this embodiment is configured such that the semiconductor layer 12a (12b) of each first TFT 9a (second TFT 9b) has the source region 12as (12bs) and the drain region 12ad (12bd) electrically connected to the source electrode 18a (18c) and the drain electrode 18b (18d), respectively, via the first contact hole Ha (He) and the second contact hole Hb (Hd). Here, the base coat film 11a in the lower layer of the first TFT 9a (second TFT 9b) includes the third base coat film 11ac composed of an amorphous silicon film. The third base coat film 11ac accordingly serves as an etching stopper in dry etching for forming the first contact hole Ha (Hc) and the second contact hole Hb (Hd), even if the chipped portion C occurs in the semiconductor layers 12a and 12b. Dry etching accordingly stops at the surface layer of the third base coat film 11ac, thus enabling the first base coat film 11aa, the second base coat film 11ab, and the third base coat film 11ac to protect the resin substrate layer 10. This can prevent moisture ingress from the resin substrate layer 10 into the organic EL element 35.

The organic EL display device 50a according to this embodiment is configured such that the first resin layer 8a and the etched surface of the third base coat film 11ac are in contact at the bending portion B. This configuration can improve the adhesion of the first resin layer 8a.

Second Embodiment

Figure 13:
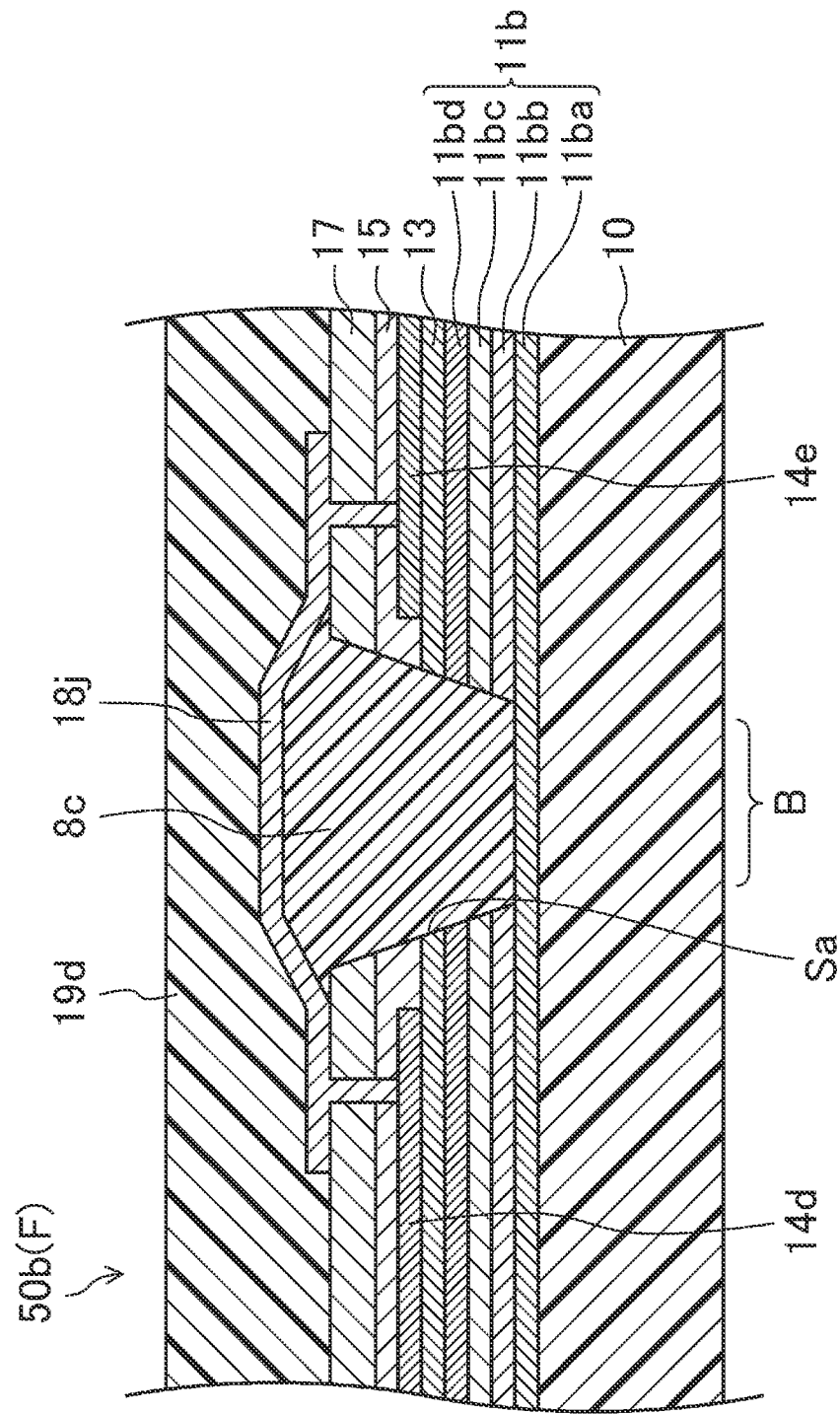
FIG. 13 is a sectional view of the bending portion in the frame region of an organic EL display device according to a second embodiment of the present invention, and corresponds to FIG. 9.
Figure 14:
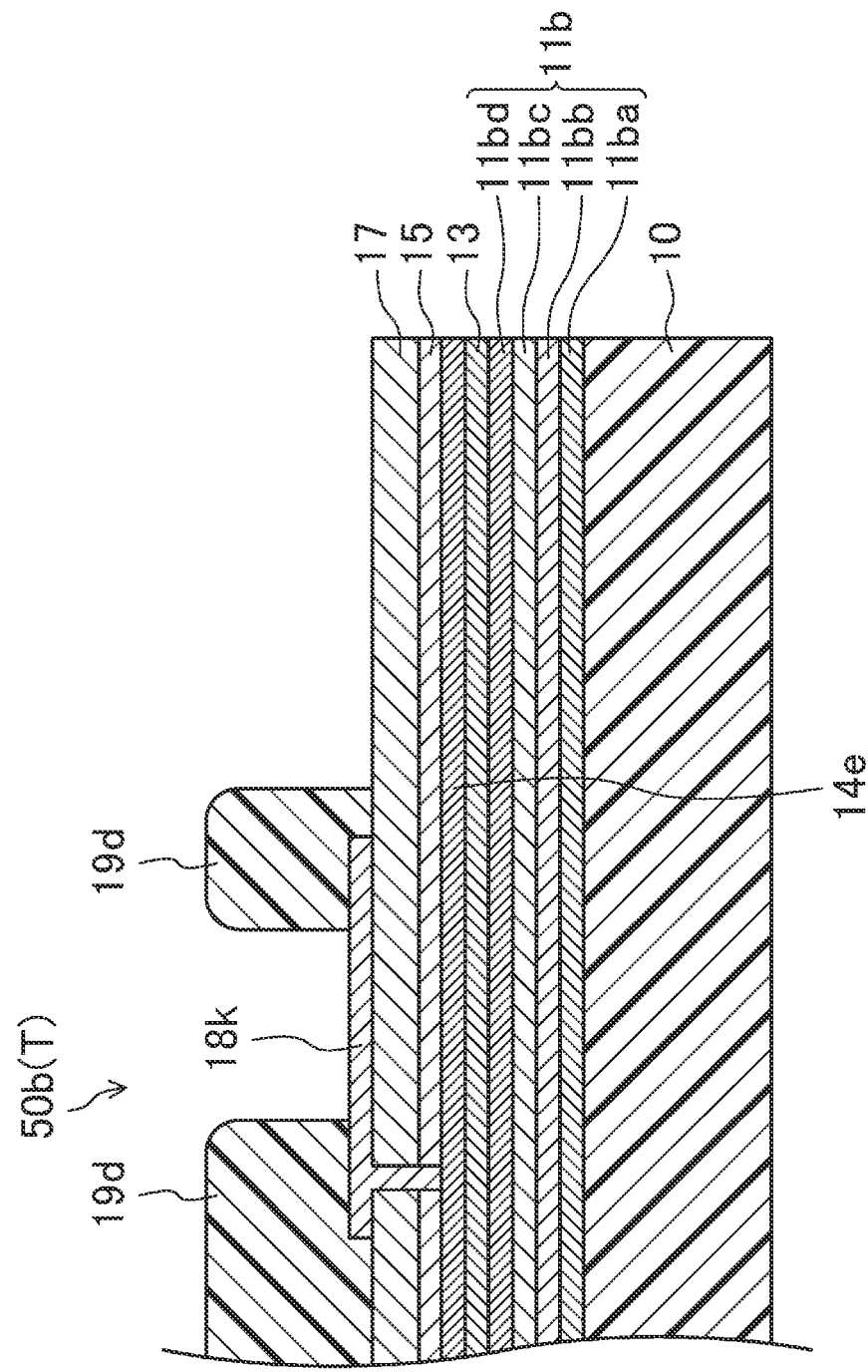
FIG. 14 is a sectional view of the terminal section in the frame region of the organic EL display device according to the second embodiment of the present invention, and corresponds to FIG. 10.

FIGS. 13 to 15 illustrate a display device according to a second embodiment of the present invention. FIG. 13 is a sectional view of the bending portion B in the frame region F of an organic EL display device 50b according to this embodiment, and corresponds to FIG. 9. FIG. 14 is a sectional view of the terminal section T in the frame region F of the organic EL display device 50b, and corresponds to FIG. 10. FIG. 15 is a sectional view of the terminal section T in the frame region F of an organic EL display device 50ba, which is a modification of the organic EL display device 50b, and corresponds to FIG. 10. In the following embodiments, the same components as those illustrated in FIGS. 1 to 12 will be denoted by the same signs and will not be elaborated upon.

The organic EL display device 50a according to the first embodiment has the base coat film 11a including the third base coat film 11ac composed of an amorphous silicon film. The organic EL display device 50b according to the present embodiment has a base coat film 11b including a first base coat film 11ba composed of an amorphous silicon film.

The organic EL display device 50b substantially has the same configuration as the organic EL display device 50a according to the first embodiment with the exception that the organic EL display device 50b includes the base coat film 11b instead of the base coat film 11a, included in the organic EL display device 50a according to the first embodiment.

The base coat film 11b includes the first base coat film 11ba, a second base coat film 11bb, a third base coat film 11bc, and a fourth base coat film 11bd sequentially stacked on the resin substrate layer 10, as illustrated in FIGS. 13 and 14. Here, the first base coat film 11ba is composed of an about 100 nm thick semiconductor film, such as an amorphous silicon film. Moreover, the second base coat film 11bb is composed of an about 100 nm thick inorganic insulating film made of, but not limited to, silicon nitride. Moreover, the third base coat film 11bc is composed of an about 300 nm thick inorganic insulating film made of, but not limited to, silicon oxide. Moreover, the fourth base coat film 11bd is composed of an about 300 nm thick inorganic insulating film made of, but not limited to, silicon oxide. It is noted that the first base coat film 11ba needs to be disposed at least all over the display region D.

As illustrated in FIG. 13, the organic EL display device 50b includes the following at the bending portion B in the frame region F: the bending-portion slit Sa disposed in the base coat film 11b, the gate insulating film 13, the first interlayer insulating film 15 and the second interlayer insulating film 17; a first resin layer 8c filled in the bending-portion slit Sa; the plurality of routed wires 18j disposed on the first resin layer 8c; and the protective layer 19d disposed over the individual routed wires 18j.

As illustrated in FIG. 13, the bending-portion slit Sa penetrates the upper layer of the base coat film 11b, the gate insulating film 13, the first interlayer insulating film 15 and the second interlayer insulating film 17, thus being open upward, and is in the form of a groove penetrating in the direction where the bending portion B extends, so as to expose the upper surface of the first base coat film 11ba.

The first resin layer 8c is made of organic resin material, such as polyimide resin.

In this embodiment, the organic EL display device 50b includes the base coat film 11b, the gate insulating film 13, the first interlayer insulating film 15, and the second interlayer insulating film 17, all of which extend to the perimeter surface of the resin substrate layer 10. In some embodiments, the organic EL display device 50ba may be provided, with the upper layer of the base coat film 11b, the gate insulating film 13, the first interlayer insulating film 15 and the second interlayer insulating film 17 being removed at the edge of the resin substrate layer 10, as illustrated in FIG. 15.

Like the organic EL display device 50aa according to the modification of the first embodiment, the first base coat film 11ba and a second resin layer 8d are in contact with each other at the edge of the organic EL display device 50ba, as illustrated in FIG. 15. The second resin layer 8d is made of the same material and disposed in the same layer as the first resin layer 8c. This organic EL display device 50ba, which includes a thin inorganic insulating film overlapping the cutting line Y (see FIG. 11), can be easily cut out from a motherboard.

Like the organic EL display device 50a according to the first embodiment, the organic EL display device 50b is flexible, and is designed to display an image when the light-emitting layer 3 of the organic EL layer 23 is caused to emit light in each sub-pixel P, as appropriate, via the first TFT 9a and the second TFT 9b.

The organic EL display device 50b according to this embodiment can be manufactured using the aforementioned method for manufacturing the organic EL display device 50a according to the first embodiment, with the exception that the order of film formation by plasma CVD in forming the base coat film 11a needs to be changed.

As described above, the organic EL display device 50b according to this embodiment is configured such that the semiconductor layer 12a (12b) of each first TFT 9a (second TFT 9b) has the source region 12as (12bs) and the drain region 12ad (12bd) electrically connected to the source electrode 18a (18c) and the drain electrode 18b (18d), respectively, via the first contact hole Ha (Hc) and the second contact hole Hb (Hd). Here, the base coat film 11b in the lower layer of the first TFT 9a (second TFT 9b) includes the first base coat film 11ba composed of an amorphous silicon film. The first base coat film 11ba thus serves as an etching stopper in dry etching for forming the first contact hole Ha (He) and the second contact hole Hb (Hd), even if the chipped portion C occurs in the semiconductor layers 12a and 12b. Dry etching accordingly stops at the surface layer of the first base coat film 11ba, thus enabling the first base coat film 11ba to protect the resin substrate layer 10. This can prevent moisture ingress from the resin substrate layer 10 into the organic EL element 35.

The organic EL display device 50b according to this embodiment is configured such that the first resin layer 8c and the etched surface of the first base coat film 11ba are in contact at the bending portion B. This configuration can improve the adhesion of the first resin layer 8c.

The organic EL display device 50b according to this embodiment is configured such that the second base coat film 11bb, the third base coat film 11bc, the fourth base coat film 11bd, the gate insulating film 13, the first interlayer insulating film 15, and the second interlayer insulating film 17, each of which is composed of an inorganic insulating film, are removed at the bending portion B. This configuration can prevent a break in the inorganic insulating films at the bending portion B, thereby preventing a break in the routed wires 18j.

OTHER EMBODIMENTS

The foregoing embodiments have described, by way of example, an organic EL layer having a five-ply stack of a hole injection layer, a hole transport layer, a light-emitting layer, an electron transport layer and an electron injection layer. In some embodiments, an organic EL layer may be provided that has a three-ply stack of a hole injection-and-transport layer, a light-emitting layer and an electron transport-and-injection layer.

The foregoing embodiments have described, by way of example, an organic EL display device that has a first electrode as an anode and a second electrode as a cathode. The present invention is also applicable to an organic EL display device in which an organic EL layer has an inverted stack of layers: the first electrode as a cathode and the second electrode as an anode.

The foregoing embodiments have described, by way of example, an organic EL display device that includes, as a drain electrode, an electrode of a TFT connected to the first electrode. The present invention is also applicable to an organic EL display device that includes, as a source electrode, an electrode of a TFT connected to the first electrode.

The foregoing embodiments have described an organic EL display device as a display device by way of example. The present invention is applicable to a display device that includes a plurality of light-emitting elements driven by current. For instance, the present invention is applicable to a display device that includes quantum-dot light-emitting diodes (QLEDs), which are light-emitting elements using a quantum-dot-containing layer.

INDUSTRIAL APPLICABILITY

As described above, the present invention is useful for a flexible display device.

The invention claimed is:

1. A display device comprising:
   a resin substrate;
   a thin-film-transistor (TFT) layer disposed on the resin substrate, the TFT layer comprising a stack of, in sequence, a base coat film, a semiconductor film, a gate insulating film, a first metal film, an interlayer insulating film, a second metal film, and a flattening film;
   a light-emitting element disposed on the TFT layer and forming a display region; and
   a plurality of TFTs disposed in the TFT layer in the display region,
   each of the plurality of TFTs including:
      a semiconductor layer composed of the semiconductor film on the base coat film, the semiconductor layer having a channel region, a source region, and a drain region, the channel region being interposed between the source and drain regions, wherein the gate insulating film is disposed over the semiconductor layer,
      a gate electrode composed of the first metal film on the gate insulating film, the gate electrode overlapping the channel region, wherein the interlayer insulating film is disposed over the gate electrode,
      a source electrode composed of the second metal film on the interlayer insulating film, wherein the source electrode is electrically connected to the source region via a first contact hole disposed in the gate insulating film and the interlayer insulating film, and
      a drain electrode composed of the second metal film on the interlayer insulating film, wherein the drain electrode is electrically connected to the drain region via a second contact hole disposed in the gate insulating film and the interlayer insulating film, wherein:
   the base coat film includes an amorphous silicon film disposed at least all over the display region,
   a frame region is disposed around the display region,
   the frame region has an end provided with a terminal section,
   a bending portion extends in a direction between the display region and the terminal section,
   the base coat film, the gate insulating film, and the interlayer insulating film have, at the bending portion, a bending-portion slit exposing the amorphous silicon film,
   the bending-portion slit is filled with a first resin layer, and
   a plurality of routed wires is disposed on the first resin layer so as to extend in parallel with each other from a location adjacent to the display region toward the terminal section, the plurality of routed wires being composed of the second metal film.

2. The display device according to claim 1, wherein the base coat film includes a silicon oxide film disposed in an uppermost layer adjacent to the semiconductor film.

3. The display device according to claim 2, wherein the silicon oxide film is disposed immediately on the amorphous silicon film.

4. The display device according to claim 1, wherein the amorphous silicon film is in contact with a second resin layer at an end of the resin substrate, wherein the second resin layer is made of the same material and disposed in the same layer as the first resin layer.

5. The display device according to claim 4, wherein the base coat film, the gate insulating film, and the interlayer insulating film have, along an edge of the frame region, an edge-portion slit exposing the amorphous silicon film, and
the amorphous silicon film and the second resin layer are in contact with each other in the edge-portion slit.

6. The display device according to claim 1, wherein the amorphous silicon film is disposed in a lowermost layer of the base coat film adjacent to the resin substrate.

7. The display device according to claim 1, wherein the semiconductor layer is composed of an oxide semiconductor.

8. The display device according to claim 7, wherein the oxide semiconductor is an In-Ga—Zn-O oxide semiconductor.

9. The display device according to claim 1, wherein the light-emitting element is an organic EL element.

* * * * *